(12) United States Patent
Jones et al.

(10) Patent No.: US 7,378,920 B2
(45) Date of Patent: May 27, 2008

(54) METHODS AND APPARATUS FOR A HIGH-FREQUENCY OUTPUT MATCH CIRCUIT

(75) Inventors: Jeffrey K. Jones, Tempe, AZ (US);
Basim H. Noori, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 219 days.

(21) Appl. No.: 11/354,472

(22) Filed: Feb. 14, 2006

(65) Prior Publication Data
US 2007/0188259 A1   Aug. 16, 2007

(51) Int. Cl.
*H03H 7/38* (2006.01)
(52) U.S. Cl. ................................ 333/32; 333/22 R
(58) Field of Classification Search .................. 333/32, 333/33, 22 R, 28 R, 1.1
See application file for complete search history.

(56) References Cited

U.S. PATENT DOCUMENTS 6,822,321 B2   11/2004   Crescenzi, Jr.

2003/0011443 A1*   1/2003   Liu et al. .................... 333/126

FOREIGN PATENT DOCUMENTS

JP   08037433 A   *   2/1996

* cited by examiner

*Primary Examiner*—Stephen E. Jones
(74) *Attorney, Agent, or Firm*—Ingrassia, Fisher & Lorenz, P.C.

(57) ABSTRACT

An output match circuit is coupled between the terminal of a high-frequency device and a ground terminal. The output match circuit includes an LC shunt and an LC notch serially coupled to the LC shunt, wherein the LC notch includes a resonant capacitive element in series with a resonant inductive element. The LC notch may simply include a resonant inductive element coupled directly to the ground terminal. The series inductive element may have a terminal coupled between the resonant capacitive element and the resonant inductive element.

20 Claims, 1 Drawing Sheet

METHODS AND APPARATUS FOR A HIGH-FREQUENCY OUTPUT MATCH CIRCUIT

TECHNICAL FIELD

The present invention relates generally to high-frequency device components and, more particularly, to output match circuitry used for impedance transformation in power amplifier applications.

BACKGROUND

High-power RF devices and other high-frequency devices have achieved wide popularity in recent years, particularly in cellular base-station applications, where it is desirable to provide high instantaneous bandwidth at a fairly high power level. Due to the nature of RF power devices, however, it is often necessary to employ impedance transformation circuitry in conjunction with the amplifier output.

Prior art impedance transformation circuits typically include a shunt inductance element in series with a large capacitor configured to provide DC blocking. Such shunt capacitors may, for example, be on the order of 200 pF for a 50 W RF power device. The resonant frequency of DC blocking capacitors combined with the presence of an external bias (which has its own effective capacitance and inductance) greatly limit the low frequency instantaneous bandwidth of an amplifier. Thus, the use of traditional shunt output match circuits will become increasingly undesirable as the need for greater bandwidth increases. Furthermore, the use of large capacitors often results in output match losses (Q).

Accordingly, it is desirable to provide output match circuitry with an appropriate base-band (low-frequency) resonant frequency and greater instantaneous bandwidth. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For the sake of brevity, conventional techniques related to semiconductor processing, package design, wire bonding, component modeling, and the like may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

In general, an output match circuit is coupled to the terminal of a high-frequency device (e.g., the drain terminal of a RF power MOSFET), wherein the output match circuit includes an LC shunt and an LC notch serially coupled to the LC shunt, the LC notch including a resonant capacitive element in series with a resonant inductive element. In this way, the total capacitance of the circuit is reduced, improving the instantaneous bandwidth of the amplifier.

Figure 1:
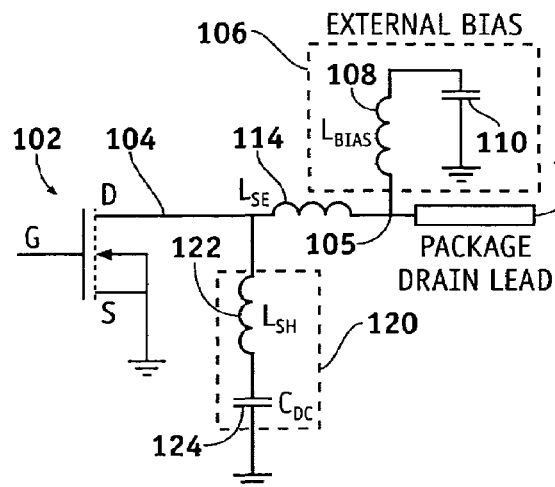
FIG. 1 is schematic overview depicting the use of a typical prior art matching circuit.

Referring to FIG. 1, a typical RF power amplifier circuit with output matching can be modeled as shown. In general, a field effect transistor (FET) 102 (or other high-frequency power component) has a series inductive element (or simply "inductor" or "$L_{SE}$") coupled between drain 104 and package drain lead 112. An external bias 106 is modeled as a bias inductive element 108 in series with a capacitive element 110, and is coupled to node 105 between package drain lead 112 and inductor 114.

A typical output match circuit 120, which is also coupled to drain 104 of FET 102, includes a shunt inductive element 122 (also referred to as a "shunt inductor," or "$L_{SH}$") and a shunt capacitive element 124 (also referred to as a "shunt capacitor," "$C_{DC}$," or "DC blocking capacitor) configured in series to ground. Inductor 122 and capacitor 124 are collectively referred to as a shunt LC output match. As is known in the art, the values for shunt inductor 122 and blocking capacitor 124 in output match circuit 120 may be selected to provide a particular desired impedance transformation at RF frequencies of interest, usually the pass band of the application.

Figure 2:
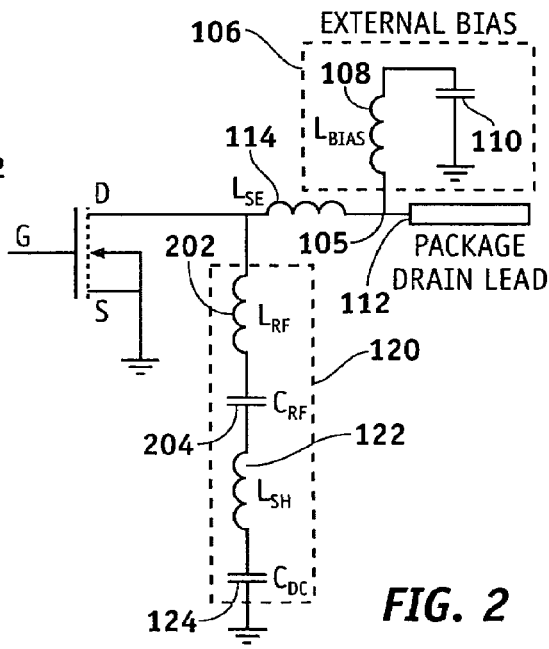
FIG. 2 is a schematic diagram of an output match circuit in accordance with one embodiment.

In accordance with one embodiment, additional LC notch components are placed in series with the shunt LC output match components, thereby reducing the effective capacitance of the RF match circuitry and improving the instantaneous bandwidth. More particularly, referring to FIG. 2, an output match circuit 120 in accordance with one embodiment includes a resonant inductive element 202 (also referred to as "$L_{RF}$," "resonant inductor," "notch inductor," "inductor," or simply a "transmission line") in series with a resonant capacitive element 204 (also referred to as "$C_{RF}$," "resonant capacitor," "notch capacitor," "printed capacitor," or simply "capacitor").

These two components, which are collectively referred to as the "LC notch components," are coupled between the shunt LC output match (122, 124) and drain 104. Thus, in the illustrated embodiment of FIG. 2, output match circuit 120 includes four components connected in series: notch inductor 202, notch capacitor 204, shunt inductor 122, and blocking capacitor 124. The configuration and order of these serial components may be altered without affecting the base-band (low-frequency) behavior of the circuit.

While the total capacitance of the output match circuit shown in FIG. 1 is simply equal to the value of blocking capacitor 124. The improved output match circuitry 120 depicted in FIG. 2 exhibits a lower total capacitance by virtue of the series notch capacitor 204. In general, the value of notch capacitor 204 will be substantially less than that of the blocking capacitor 124. More particularly, the total capacitance is given by:

$$C_{tot} = [C_{RF}^{-1} + C_{DC}^{-1}]^{-1}$$

where $C_{tot}$ is the total capacitance, $C_{RF}$ is the notch capacitor value, and $C_{DC}$ is the blocking capacitor value.

By decreasing the total capacitance value, the resonant frequency of the circuit increases by the square root of the ratio of capacitances, i.e.:

$$\frac{BW_{new}}{BW_{old}} = \sqrt{\frac{C_{DC}}{C_{tot}}}$$

where $BW_{new}$ is the improved bandwidth of the circuit with the notch components, and $BW_{old}$ is the old bandwidth without the notch components.

The envelope frequency, $f_{env}$, of the resulting system is given by:

$$f_{env} = \frac{1}{2\pi\sqrt{L_{eff}C_{tot}}}$$

where $L_{eff}$ is the effective inductance, and $C_{tot}$ is the resulting total capacitance of the match circuit with the notch components. The effective inductance is the combination of the series, shunt, and bias inductive elements.

In one embodiment, in a device operating at about 2.0 GHz, $L_{RF}$ 202 has a value ranging from approximately 5.5 pH to 37 pH, and $C_{RF}$ 204 has a value ranging from approximately 10 pF to 150 pF. In typical embodiments, series inductor 114 has a value of about 0.2 nH, shunt inductor 122 has a value of about 0.25 nH, and blocking capacitor 124 has a value of about 200 pF. In a particular embodiment, $C_{RF}$ 204 has a value of approximately 69 pF.

Figure 3:
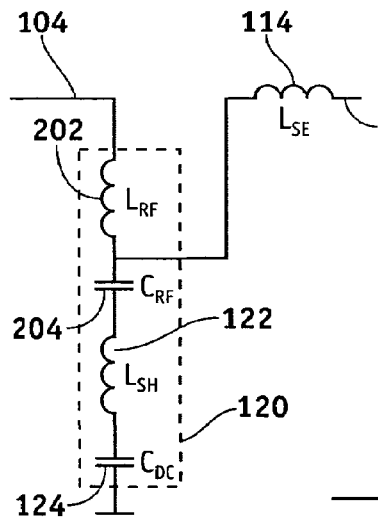
FIG. 3 is a schematic diagram of an output match circuit in accordance with another embodiment.

FIG. 3 shows an alternate embodiment wherein series inductance 114 is coupled between notch inductor 202 and notch capacitor 204. In this embodiment, the notch inductor may be shortened. In a particular embodiment, again corresponding to a 2 GHz device, $L_{RF}$ 202 has a value ranging from approximately 5 pH to 25 pH, and $C_{RF}$ 204 has a value ranging from approximately 50 pF to 150 pF.

Figure 4:
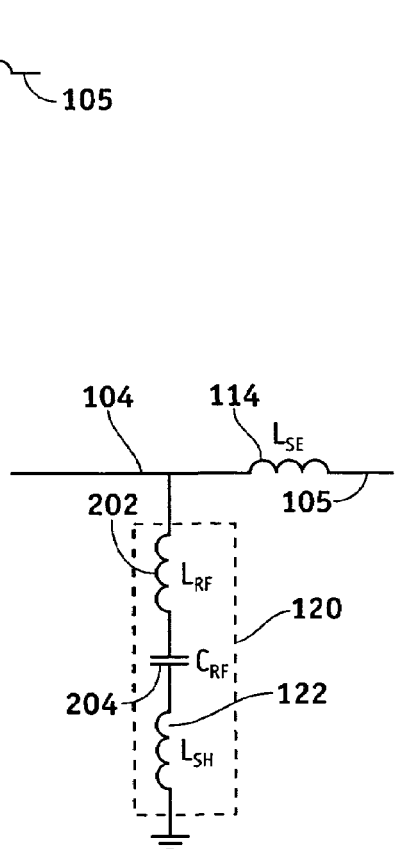
FIG. 4. is a schematic diagram of an output match circuit in accordance with another embodiment.

FIG. 4 depicts an alternate embodiment wherein the DC blocking capacitor has been removed, and the shunt inductor 122 is coupled directly to ground. This topology makes use of the fact that the DC voltage is effectively blocked by $C_{RF}$ 204. In this embodiment, the power loss is reduced (replacing the quality factor limitation of $C_{DC}$ 124 with a direct short to ground), while still performing the desired impedance transformation and bandwidth improvement.

Figure 5:
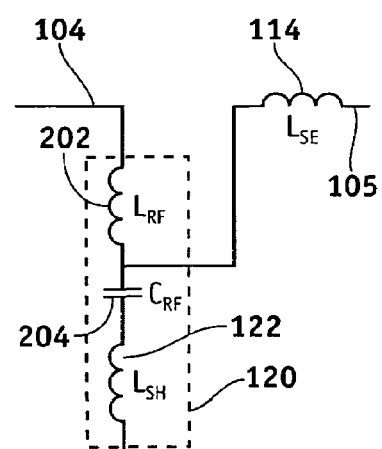
FIG. 5 is a schematic diagram of an output match circuit in accordance with yet another embodiment.

FIG. 5 shows yet another embodiment, which is a variation of the circuit shown in FIG. 4, but where series inductor 114 is coupled between notch inductor 202 and notch capacitor 204.

It will be appreciated that values for the various inductive and capacitive elements described above may be selected to achieve particular frequency characteristics as may be desired, and that the elements may be implemented using a variety of known materials and structures traditionally used in semiconductor devices.

For example, the blocking capacitor 124 may be implemented using a standard MOSCAP device known in the art or any other suitable device structure.

In one embodiment, the shunt inductance 122 is implemented using a series of parallel bonding wires. The series inductance 114 is provided by an array of parallel wires leading to package lead 112.

Notch inductor 202 is implemented, for example, using an array of parallel bond wires. Notch capacitor 204 may be implemented, for example, via a series of multi-cell capacitors. For example, a 69 pF capacitor may be provided by forming a series of 10 multi-cell capacitors in accordance with known semiconductor fabrication techniques.

In summary, various embodiments of output match circuits have been described. In one embodiment, an output match circuit is coupled between a terminal of a high-frequency device and a ground terminal, the output match circuit comprising: an LC shunt, the LC shunt including a shunt inductive element and a shunt capacitive element; and an LC notch serially coupled to the LC shunt.

In one embodiment, the LC notch comprises a resonant capacitive element in series with a resonant inductive element. In a particular embodiment, the resonant capacitive element is a series of multi-cell capacitors incorporated into the high-frequency device. In another, the resonant inductive element is an array of bond wires coupled to the high-frequency device. In accordance with one embodiment, the LC notch comprises a resonant inductive element coupled to the ground terminal. In a further embodiment, the circuit includes a series inductive element having a terminal coupled between the resonant capacitive element and the resonant inductive element.

A method for providing impedance transformation for a high-frequency power device having an enclosure includes: selecting predetermined component values for a shunt capacitive element, a shunt inductive element, a notch capacitive element, and a notch inductive element based on a desired RF bandwidth and base-band (low frequency) bandwidth for the device; and forming, within the enclosure, the shunt capacitive element, the shunt inductive element, the notch capacitive element, and the notch inductive element in series between a terminal of the device and a ground terminal.

In one embodiment, forming the shunt inductive element includes forming an array of wire bonds coupled to the device. In another, forming the shunt capacitive element includes forming a series of multi-cell capacitors on the device.

An RF power device in accordance with one embodiment includes: a MOSFET component having a drain node; an output match circuit coupled between the drain node and a ground node, the output match circuit including an LC shunt in series with an LC notch; and a series inductance associated with a drain lead and coupled to the drain node.

In one embodiment, the LC shunt comprises a shunt inductive element in series with a shunt capacitive element. In another, the shunt inductive element comprises an array of wire bonds connected to the MOSFET component. In a particular embodiment, the LC notch comprises a notch inductive element in series with a notch capacitive element. In a further embodiment, the notch inductive element includes an array of wire bonds connected to the MOSFET component.

In accordance with a particular embodiment, in a 2 GHz application, the shunt inductive element has a value of between approximately 0.1 and 0.3 nH and the shunt capacitive element has a value of between approximately 100 pF and 300 pF. In another, the notch inductive element has a value of between approximately 5.5 pH and 37 pH. In accordance with one embodiment, again in a 2 GHz application, the notch capacitive element has a value of between approximately 10 pF and 150 pF. In another, the notch capacitive element has a value of between approximately 65 and 75 pF.

In accordance with an alternate embodiment, the series inductance is coupled to a node between the notch inductive element and the notch capacitive element. In another alternate embodiment, the LC notch comprises a notch inductive element connected to the ground node.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An output match circuit coupled between a terminal of a high-frequency device and a ground terminal, the output match circuit comprising:
    an LC shunt, the LC shunt including a shunt inductive element and a shunt capacitive element; and
    an LC notch serially coupled to the LC shunt.

2. The output match circuit of claim 1, wherein the LC notch comprises a resonant inductive element coupled to the ground terminal.

3. The output match circuit of claim 1, further including a series inductive element having a terminal coupled between the resonant capacitive element and the resonant inductive element.

4. The output match circuit of claim 1, wherein the LC notch comprises a resonant capacitive element in series with a resonant inductive element.

5. The output match circuit of claim 4, wherein the resonant capacitive element is a series of multi-cell capacitors incorporated into the high-frequency device.

6. The output match circuit of claim 4, wherein the resonant inductive element is an array of bond wires coupled to the high-frequency device.

7. An RF power device comprising:
    a MOSFET component having a drain node;
    an output match circuit coupled between the drain node and a ground node, the output match circuit including an LC shunt in series with an LC notch;
    a series inductance associated with a drain lead and coupled to the drain node.

8. The device of claim 7, wherein the LC notch comprises a notch inductive element connected to the ground node.

9. The device of claim 7, wherein the LC shunt comprises a shunt inductive element in series with a shunt capacitive element.

10. The device of claim 9, wherein the shunt inductive element comprises an array of wire bonds connected to the MOSFET component.

11. The device of claim 9, wherein the MOSFET component operates at approximately 2 GHz, the shunt inductive element has a value of between approximately 0.1 and 0.3 nH and the shunt capacitive element has a value of between approximately 100 pF and 300 pF.

12. The device of claim 7, wherein the LC notch comprises a notch inductive element in series with a notch capacitive element.

13. The device of claim 12, wherein the notch inductive element includes an array of wire bonds connected to the MOSFET component.

14. The device of claim 12, wherein the MOSFET component operates at approximately 2 GHz, and wherein the notch inductive element has a value of between approximately 5.5 pH and 37 pH.

15. The device of claim 12, wherein the series inductance is coupled to a node between the notch inductive element and the notch capacitive element.

16. The device of claim 12, wherein the MOSFET component operates at approximately 2 GHz, and wherein the notch capacitive element has a value of between approximately 10 pF and 150 pF.

17. The device of claim 16, wherein the MOSFET component operates at approximately 2 GHz, and wherein the notch capacitive element has a value of between approximately 65 pF and 75 pF.

18. A method for providing impedance transformation for a high-frequency power device having an enclosure, the method including:
    selecting predetermined component values for a shunt capacitive element, a shunt inductive element, a notch capacitive element, and a notch inductive element based on a desired bandwidth for the device; and
    forming, within the enclosure, the shunt capacitive element, the shunt inductive element, the notch capacitive element, and the notch inductive element in series between a terminal of the device and a ground terminal.

19. The method of claim 18, wherein forming the shunt inductive element includes forming an array of wire bonds coupled to the device.

20. The method of claim 18, wherein forming the shunt capacitive element includes forming a series of multi-cell capacitors on the device.

* * * * *